| (12) | United States Patent | (10) Patent No.: US 10,734,367 B2 |
|---|---|---|
| | Ryu et al. | (45) Date of Patent: Aug. 4, 2020 |

(54) SEMICONDUCTOR PACKAGE AND METHOD OF FABRICATING THE SAME

(71) Applicant: SAMSUNG ELECTRONICS CO., LTD., Suwon-si, Gyeonggi-Do (KR)

(72) Inventors: Seung-Kwan Ryu, Seongnam-si (KR); Yonghwan Kwon, Suwon-si (KR); Yun Seok Choi, Hwaseong-si (KR); Chajea Jo, Yongin-si (KR); Taeje Cho, Yongin-si (KR)

(73) Assignee: Sansumg Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/232,159

(22) Filed: Dec. 26, 2018

(65) Prior Publication Data

US 2019/0164942 A1    May 30, 2019

Related U.S. Application Data

(63) Continuation of application No. 15/357,741, filed on Nov. 21, 2016, now Pat. No. 10,186,500.

(30) Foreign Application Priority Data

Dec. 10, 2015    (KR) .................. 10-2015-0176044

(51) Int. Cl.
  *H01L 25/10*    (2006.01)
  *H01L 23/00*    (2006.01)
  (Continued)

(52) U.S. Cl.
  CPC ........ *H01L 25/105* (2013.01); *H01L 23/3128* (2013.01); *H01L 23/3135* (2013.01);
  (Continued)

(58) Field of Classification Search
  CPC ..... H01L 2225/1076; H01L 2225/1064; H01L 2225/1088; H01L 2225/1041;
  (Continued)

(56) References Cited

U.S. PATENT DOCUMENTS

| 6,790,706 B2 | 9/2004 | Jeung et al. |
|---|---|---|
| 7,208,345 B2 | 4/2007 | Meyer et al. |

(Continued)

FOREIGN PATENT DOCUMENTS

| JP | 2002289766 A | 10/2002 |
|---|---|---|
| JP | 2014096547 A | 5/2014 |
| JP | 2014130877 A | 7/2014 |

*Primary Examiner* — Marcos D. Pizarro
*Assistant Examiner* — Antonio B Crite
(74) *Attorney, Agent, or Firm* — Volentine, Whitt & Francos, PLLC

(57) ABSTRACT

A semiconductor package includes upper and lower semiconductor chip packages, and a redistribution wiring layer pattern interposed between the packages. The lower package includes a molding layer in which at least one chip is embedded, and has a top surface and an inclined sidewall surface along which the redistribution wiring layer pattern is formed. The upper and lower packages are electrically connected to through the redistribution wiring layer pattern. A first package may be formed by a wafer level packaging technique and may include a redistribution wiring layer as a substrate, a semiconductor chip disposed on the redistribution wiring layer, and a molding layer on which the lower package, redistribution wiring layer pattern and upper package are disposed.

19 Claims, 11 Drawing Sheets

(51) Int. Cl.
*H01L 25/03* (2006.01)
*H01L 23/538* (2006.01)
*H01L 23/31* (2006.01)
*H01L 25/00* (2006.01)
*H01L 21/56* (2006.01)

(52) U.S. Cl.
CPC ...... *H01L 23/5386* (2013.01); *H01L 23/5389* (2013.01); *H01L 24/19* (2013.01); *H01L 25/03* (2013.01); *H01L 25/50* (2013.01); *H01L 21/561* (2013.01); *H01L 21/568* (2013.01); *H01L 24/16* (2013.01); *H01L 24/96* (2013.01); *H01L 2224/04105* (2013.01); *H01L 2224/12105* (2013.01); *H01L 2224/16225* (2013.01); *H01L 2224/16227* (2013.01); *H01L 2224/18* (2013.01); *H01L 2224/24137* (2013.01); *H01L 2224/97* (2013.01); *H01L 2225/1023* (2013.01); *H01L 2225/1035* (2013.01); *H01L 2225/1041* (2013.01); *H01L 2225/1058* (2013.01); *H01L 2225/1064* (2013.01); *H01L 2225/1076* (2013.01); *H01L 2225/1088* (2013.01)

(58) Field of Classification Search
CPC . H01L 2224/32145; H01L 2224/48091; H01L 2224/04105; H01L 25/105; H01L 23/5386; H01L 23/5389; H01L 23/3135; H01L 24/96
See application file for complete search history.

(56) References Cited

U.S. PATENT DOCUMENTS

| | | | |
|---|---|---|---|
| 7,595,222 | B2 | 9/2009 | Shimoishizaka et al. |
| 7,667,318 | B2 | 2/2010 | Yang et al. |
| 7,932,162 | B2 | 4/2011 | Sagara et al. |
| 8,884,421 | B2 | 11/2014 | Kang et al. |
| 8,916,481 | B2 | 12/2014 | Gan et al. |
| 9,117,816 | B2 | 8/2015 | Lin et al. |
| 9,123,763 | B2 | 9/2015 | Yu et al. |
| 2004/0227238 | A1 | 11/2004 | Hashimoto |
| 2009/0014876 | A1 | 1/2009 | Youn et al. |
| 2009/0039491 | A1 | 2/2009 | Kim et al. |
| 2009/0239336 | A1* | 9/2009 | Lee ............... H01L 21/6835 438/107 |
| 2013/0292846 | A1* | 11/2013 | Lee ............... H01L 23/538 257/774 |
| 2015/0115476 | A1 | 4/2015 | Chen |
| 2015/0187743 | A1 | 7/2015 | Yu et al. |

\* cited by examiner

SEMICONDUCTOR PACKAGE AND METHOD OF FABRICATING THE SAME

PRIORITY STATEMENT

This is a Continuation of U.S. application Ser. No. 15/357,741, filed Nov. 21, 2016, now U.S. Pat. No. 10,186,500 issued on Jan. 22, 2019, which claims priority under 35 U.S.C. § 119 to Korean Patent Application No. 10-2015-0176044, filed on Dec. 10, 2015, in the Korean Intellectual Property Office, the disclosure of which is hereby incorporated by reference in its entirety.

BACKGROUND

The inventive concept relates to a semiconductor package and, more particularly, to a semiconductor package including a plurality of semiconductor chips and to a method of fabricating the same.

To use an integrated circuit chip (or a semiconductor chip) in an electronic product, the integrated circuit chip may be encapsulated by a packaging technique, thereby forming a semiconductor package including the integrated circuit chip. In a general semiconductor package, a semiconductor chip may be mounted on a printed circuit board (PCB) and may be electrically connected to the PCB through bonding wires or bumps. High-performance, high-speed and small electronic components have been increasingly in demand in the electronics industry. To satisfy these demands, a plurality of semiconductor chips may be stacked on one substrate and/or a package may be stacked on another package.

SUMMARY

According to an aspect of the inventive concept, a method of fabricating a semiconductor package includes providing a first package comprising a substrate, a first semiconductor chip, and a first molding layer, providing a second package comprising a second semiconductor chip and a second molding layer on the second semiconductor chip, wherein the second semiconductor chip has a chip pad disposed at a top surface of the second semiconductor chip and exposed by the second molding layer, and wherein the second package has a bottom surface, a top surface narrower than the bottom surface in a given direction parallel to a top surface of the substrate and being substantially parallel to the bottom surface, and a sidewall surface extending in a direction of inclination that is oblique with respect to the bottom surface, mounting the second package on the first package in such an orientation that the bottom surface of the second package faces the first package, forming a redistribution wiring layer pattern along the top surface and the sidewall surface of the second package, the redistribution wiring layer pattern being electrically connected to the chip pad of the second semiconductor chip, and mounting a third semiconductor chip on the redistribution wiring layer pattern and electrically connecting the third semiconductor chip to the redistribution wiring layer pattern.

According to another aspect of the inventive concept, a method of fabricating a semiconductor package includes providing a lower package comprising a substrate, a first semiconductor chip mounted on the substrate, a first molding layer covering the first semiconductor chip on the substrate; an electrical interconnection extending in the first molding layer on the substrate, a second molding layer on the first molding layer, the second molding layer having a bottom surface narrower than the first molding layer, a top surface narrower than the bottom surface, and a sidewall surface extending in a direction of inclination that is oblique relative to a top surface of the substrate, and a second semiconductor chip embedded in the second molding layer, the second semiconductor chip including a chip pad disposed at a top surface thereof, forming a redistribution wiring layer pattern on the lower package and as electrically connected to both the interconnection and the chip pad of the second semiconductor chip of the lower package, and mounting a third semiconductor chip to the lower package as disposed on the redistribution wiring layer pattern and as electrically connected to the redistribution wiring layer pattern.

According to still another aspect of the inventive concept, a method of fabricating a semiconductor package includes forming a semiconductor package having a substantially trapezoidal cross-sectional shape and including a first semiconductor chip and a first molding layer in which the first semiconductor chip is embedded, the semiconductor package having a bottom surface, a top surface substantially parallel to the bottom surface, and a sidewall surface extending to and between edges of the top and bottom surfaces in a direction of inclination that is oblique with respect to the top and bottom surfaces, and the first semiconductor chip having an active surface constituting the top surface of the semiconductor package, forming a redistribution wiring layer pattern on the first molding layer and electrically connected to the first semiconductor chip at the active surface thereof, wherein respective parts of the redistribution wiring layer pattern are disposed on the top and sidewall surfaces of the first molding layer as extending substantially parallel to the top surface and the direction of inclination, respectively, and mounting another semiconductor chip to the semiconductor package as disposed on and electrically connected to the redistribution wiring layer pattern, including by setting said another semiconductor chip on a part of the redistribution wiring layer pattern that is disposed on and extends substantially parallel to the top surface of the first molding layer, and forming another molding layer on said another semiconductor chip and the redistribution wiring layer pattern.

According to still yet another aspect of the inventive concept, a semiconductor package includes a first package comprising a substrate, a first semiconductor chip mounted on the substrate, a first molding layer covering the first semiconductor chip on the substrate, and at least one electrical interconnection within the first molding layer, a second package comprising a second semiconductor chip disposed on the first molding layer and having a chip pad, a bottom surface spaced from the first molding layer and a top surface at which chip pad is situated, and a second molding layer covering the bottom surface and sides of the second semiconductor chip, the second molding layer having a bottom surface narrower than the first package in a given direction parallel to a top surface of the substrate, a top surface narrower than the bottom surface of the second molding layer in said given direction, and a sidewall surface that extends in a direction of inclination that is oblique relative to the top surface of the substrate, a redistribution wiring layer pattern extending along a top surface of the first molding layer, the sidewall surface of the second molding layer, and the top surface of the second molding layer, the redistribution wiring layer pattern being electrically connected to the interconnection and the chip pad, and a third semiconductor chip disposed on the redistribution pattern.

BRIEF DESCRIPTION OF THE DRAWINGS

The inventive concept will become more apparent in view of the attached drawings and accompanying detailed description.

DETAILED DESCRIPTION

Figure 1:
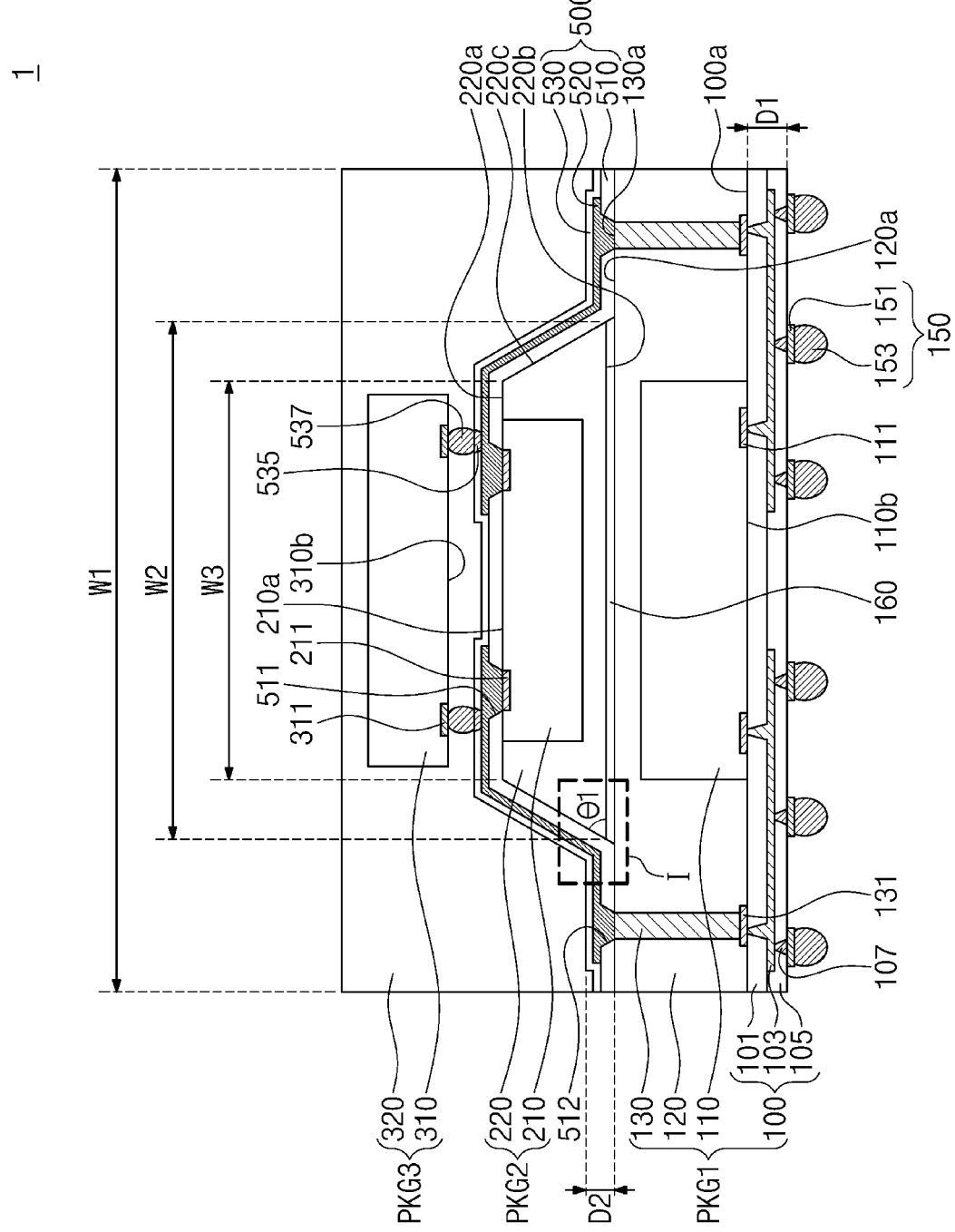
FIG. 1 is a cross-sectional view illustrating a semiconductor package according to some examples of the inventive concept.

The inventive concept will now be described more fully hereinafter with reference to the accompanying drawings, in which examples of the inventive concept are shown. The examples of the inventive concept may, however, be embodied in different forms and should not be constructed as limited to the examples set forth herein. Rather, these examples are provided so that this disclosure will be thorough and complete, and will fully convey the scope of the inventive concept to those skilled in the art. The same reference numerals or the same reference designators denote the same elements throughout the drawings.

As used herein, the singular terms "a", "an", and "the" are intended to include the plural forms as well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "on" another element, it can be directly on the other element or intervening elements may be present. In contrast, the term "directly" means that there are no intervening elements. Also, the term "connected" will generally refer to an electrical connection as the context makes clear.

Additionally, sectional views may illustrate examples of the inventive concept as idealized. Accordingly, shapes of the elements and features, etc., of the examples may vary from those illustrated according to manufacturing techniques and/or allowable errors. Therefore, unless otherwise expressly stated, elements and features, etc., of the examples of the inventive concept are not limited to the specific shapes illustrated in the drawings, but may include other shapes that may be created according to manufacturing processes.

Semiconductor packages according to some examples of the inventive concept will be described hereinafter.

FIG. 1 is a cross-sectional view illustrating a semiconductor package according to some examples of the inventive concept.

Referring to FIG. 1, a semiconductor package 1 may include first to third packages PKG1, PKG2, and PKG3 and a redistribution wiring layer pattern 500 which may be referred to hereinafter simply as "redistribution pattern 500". The first package PKG1 may include a substrate 100, a first semiconductor chip 110, a first molding layer 120, and an electrical interconnection 130. A redistribution layer may be used as the substrate 100. For example, the substrate 100 may include a metal pattern 103 and first and second insulating layers 101 and 105. For example, the metal pattern 103 may include copper. The first insulating layer 101 may cover a bottom surface 110b of the first semiconductor chip 110 and a bottom surface of the first molding layer 120. The first insulating layer 101 may be formed of a silicon-based insulating material or a polymer. The metal pattern 103 may be disposed on a bottom surface of the first insulating layer 101. The metal pattern 103 may extend into the first insulating layer 101. The second insulating layer 105 may be disposed on the bottom surface of the first insulating layer 101 to cover the metal pattern 103. The second insulating layer 105 may also be formed of a silicon-based insulating material or a polymer. In some examples, the number of the insulating layers 101 and 105 and the number of the metal pattern 103 differ from those illustrated in FIG. 1. A connection via 107 may be provided in the second insulating layer 105 so as to be in contact with the metal pattern 103. The substrate 100 may have an average thickness D1 of about 0.1 mm to about 0.5 mm, and thus a size of the semiconductor package 1 may be minimized. In certain examples, the substrate 100 may be a printed circuit board (PCB) having a circuit pattern.

An external terminal 150 may be provided on a bottom surface of the second insulating layer 105 so as to be connected to the connection via 107. The external terminal 150 may include an external pad 151 and/or a solder ball 153. The external terminal 150 may include a conductive material such as tin (Sn), silver (Ag), or an alloy thereof. A plurality of the external terminals 150 and connection vias 107 may be provided. The metal pattern 103 may extend from under the bottom surface 110b of the first semiconductor chip 110 to under the bottom surface of the first molding layer 120, and thus, the external terminals 150 may be disposed underneath both the bottom surface 110b of the first semiconductor chip 110 and the bottom surface of the first molding layer 120. Thus, a high degree of freedom exists in the layout of the external terminals 150.

The first semiconductor chip 110 may be disposed on a top surface 100a of the substrate 100. The first semiconductor chip 110 may include a first integrated circuit (not shown) such as a memory circuit, a logic circuit, or a combination thereof. The first integrated circuit may be adjacent to the bottom surface 110b of the first semiconductor chip 110. The first semiconductor chip 110 may include first chip pads 111 disposed on the bottom surface 110b thereof, and thus the bottom surface 110b of the first semiconductor chip 110 may function as an active surface. The first chip pads 111 may be connected to the first integrated circuit of the first semiconductor chip 110. Hereinafter, the term "chip pad" will refer to a pad electrically conductive material of a semiconductor chip electrically connected to the active/passive elements of an integrated circuit of the semiconductor chip and serving as a terminal by which an external device can be electrically connected to the integrated circuit. The metal pattern 103 may extend into the first insulating layer 101 so as to be connected to the first chip pads 111. Thus, the semiconductor package 1 does not need bonding wires to electrically connect the first semiconductor chip 110 to the substrate 100. As a result, the size of the semiconductor package 1 may be kept to a minimum. In some examples, an interposer (not shown) may be disposed between the substrate 100 and the first chip pads 111. The interposer may include electrically conductive (solder) balls, pillars, or (solder) bumps.

The first molding layer 120 may be provided on the substrate 100 to cover the sides and top of the first semiconductor chip 110. The first molding layer 120 may be formed of an insulating polymer such as an epoxy molding compound (EMC).

The interconnection 130 may be provided in the first molding layer 120 on the substrate 100. The interconnection 130 may have the shape of a pillar or bump. The interconnection 130 may be laterally spaced apart from the first semiconductor chip 110. The first molding layer 120 may expose a top surface 130a of the interconnection 130. A connection pad 131 may be disposed between the interconnection 130 and the substrate 100. An extending portion of the metal pattern 103 may penetrate the first insulating layer 101 so as to be connected to the connection pad 131. A plurality of the interconnections 130 may be provided. In some examples, each interconnection 130 and connection pad 131 may include copper (Cu), tin (Sn), silver (Ag), or any alloy thereof.

The second package PKG2 may be provided on the first package PKG1. The second package PKG2 may include a second semiconductor chip 210 and a second molding layer 220. The second package PKG2 may overlie (i.e., be vertically aligned or juxtaposed with) a central portion of the first package PKG1 but may not overlie an outer peripheral portion of the first package PKG1. In particular, the second package PKG2 may not cover a portion of a top surface 120a of the first molding layer 120 and the interconnections 130. The second semiconductor chip 210 may be provided on the first molding layer 120. An active surface of the second semiconductor chip 210 may face upwardly so as to be the top surface 210a of the second semiconductor chip 210 in the orientation of the semiconductor package 1 shown in the figure. Thus, for example, the second semiconductor chip 210 may include second chip pads 211 disposed on its top surface 210a. The second semiconductor chip 210 may include a second integrated circuit (not shown) disposed in the chip body thereof, and the second integrated circuit may be adjacent to the top surface 210a of the second semiconductor chip 210.

The second molding layer 220 may be provided between the first molding layer 120 and the redistribution pattern 500. The second molding layer 220 may cover the sides and bottom of the second semiconductor chip 210 and may expose the second chip pads 211. An adhesive film 160 may be provided between the first molding layer 120 and the second molding layer 220. The adhesive film 160 may include an insulating polymer, e.g., a thermosetting polymer. The second molding layer 220 may have a top surface 220a, a bottom surface 220b, and a sidewall surface 220c. The top surface 220a and the bottom surface 220b of the second molding layer 220 may be substantially parallel to the top surface 100a of the substrate 100. In the present specification, the term "substantially parallel" may include deviations from an exact degree of parallelism, within a tolerance given the processes used to fabricate and package together the first and second packages PKG1 and PKG2. A width W2 of the bottom surface 220b of the second molding layer 220 (i.e., a width of a bottom surface of the second package PKG2) may be smaller than a width W1 of the top surface 120a of the first molding layer 120 (i.e., a width of a top surface of the first package PKG1). The second molding layer 220 may not cover a portion of the top surface 120a of the first molding layer 120. A width W3 of the top surface 220a of the second molding layer 220 (i.e., a width of a top surface of the second package PKG2) may be smaller than the width W2 of the bottom surface 220b of the second molding layer 220 (i.e., the width of the bottom surface of the second package PKG2). The sidewall surface 220c of the second molding layer 220 may extend to and between an edge of the top surface 220a and an edge of bottom surface 220b as inclined relative to the top surface 100a of the substrate 100. An angle θ1 subtended by the sidewall surface 220c and the bottom surface 220b of the second molding layer 220 may be an acute angle. Thus, as shown in FIG. 1, a cross-sectional shape (of the molding layer) of the second package PKG2 may be trapezoidal.

In the present specification, a description that an element described is inclined relative to some surface or plane may mean that an imaginary straight line connecting both ends (i.e., top and bottom ends) of the element is inclined relative to that surface or plane. In other words, the "inclination" of an element may refer to a measure of the average gradient between both ends of the element. In some examples, the sidewall surface 220c of the second molding layer 220 may be a flat surface extending at an inclination relative to the top surface 100a of the substrate 100. However, the shape of the sidewall surface 220c of the second molding layer 220 is not limited thereto. That is, the sidewall surface 220c of the second molding layer 220 may have a shape other than flat and still be inclined relative to the top surface 100a of the substrate 100. In this case, the cross-sectional shape of the second package PKG2 may be deemed to be "substantially" trapezoidal. The second molding layer 220 may include an insulating polymer such as an epoxy molding compound (EMC).

The redistribution pattern 500 may extend along the top surface 120a of the first molding layer 120, the sidewall surface 220c of the second molding layer 220, and the top surface 220a of the second molding layer 220. The redistribution pattern 500 may include a first insulating pattern 510, a conductive pattern 520, and a second insulating pattern 530. The first insulating pattern 510 may cover the top surface 120a of the first molding layer 120, the sidewall surface 220c of the second molding layer 220, and the top surface 220a of the second molding layer 220. The first insulating pattern 510 may have first openings 511 exposing the second chip pads 211 and second openings 512 exposing the interconnections 130. The first insulating pattern 510 may be formed of silicon-based insulating material such as silicon oxide, silicon nitride, and/or silicon oxynitride. The conductive pattern 520 may be disposed on the first insulating pattern 510. The conductive pattern 520 may extend into the first openings 511 so as to be connected to the second chip pads 211. The conductive pattern 520 may extend into the second openings 512 so as to be connected to the interconnections 130. The second semiconductor chip 210 may be electrically connected to the substrate 100 through the conductive pattern 520 and the interconnection 130. The conductive pattern 520 may include a metal, for example, copper. The second insulating pattern 530 may be provided on the conductive pattern 520. The second insulating pattern 530 may cover the conductive pattern 520 to protect the conductive pattern 520. The second insulating pattern 530 may be formed of silicon oxide, silicon nitride, and/or silicon oxynitride. Vias 535 may be provided in the second insulating pattern 530 so as to be connected to the conductive pattern 520. In some examples, the number of the insulating patterns 510 and 530 and the number of the conductive pattern 520 differ from those illustrated in FIG. 1. The redistribution pattern 500 is thinner than a corresponding or comparative printed circuit board (PCB) capable of performing the same function. For example, an average thickness D2 of the redistribution pattern 500 may range from about 0.1 mm to about 0.5 mm. Thus, the size of the semiconductor package 1 may be kept to a minimum.

The redistribution pattern 500 disposed on the sidewall surface 220c of the second molding layer 220 may be inclined relative to the top surface 100a of the substrate 100. For example, the redistribution pattern 500 disposed on the sidewall surface 220c may subtend an acute angle with the bottom surface 220b of the second molding layer 220. The second semiconductor chip 210 may be disposed between inclined portions of the redistribution pattern 500 (as shown in the sectional view) or may be surrounded on all four sides by inclined portions of the redistribution pattern 500 (as would be seen in a plan view). If the inclined portions of the redistribution pattern 500 were omitted, it would be necessary to form an additional solder ball, solder bump, or via between the redistribution pattern 500 and the interconnection 130. According to some examples of the inventive concept, the redistribution pattern 500 may be in contact with the interconnection 130, and thus relatively few processes are required for fabricating the semiconductor package 1. The first molding layer 120 and the second molding layer 220 may fill a space between the substrate 100 and the redistribution pattern 500.

Referring again to FIG. 1, the third package PKG3 may be provided on the redistribution pattern 500. The third package PKG3 may include a third semiconductor chip 310 and a third molding layer 320. The third semiconductor chip 310 may include a third integrated circuit (not shown) disposed in a chip body thereof. The third semiconductor chip 310 may include third chip pads 311 disposed on a bottom surface thereof, i.e., the active surface of the third semiconductor chip 310 may be the bottom surface 310b in the orientation shown in the figure.

Connection terminals 537 may be provided on the redistribution pattern 500 and may be aligned with the vias 535. The connection terminals 537 may be connected to the third chip pads 311 of the third semiconductor chip 310. The third semiconductor chip 310 may be electrically connected to the first package PKG1 through the connection terminals 537 and the conductive pattern 520. Each of the connection terminals 537 may be a pillar or electrically conductive material or a solder ball. The connection terminals 537 may include a conductive material such as tin (Sn), silver (Ag), copper (Cu), or any alloy thereof. In some examples, pads (not shown) may be provided between the connection terminals 537 and the vias 535. In some examples, the connection terminals 537 may be omitted and the third chip pads 311 may be in direct contact with the vias 535 or conductive pads (not shown) disposed on the vias 535. According to some examples of the inventive concept, the second and third semiconductor chips 210 and 310 may be electrically connected to the substrate 100 through the redistribution pattern 500, and thus an additional upper substrate is not required. Thus, the size of the semiconductor package 1 may be kept to a minimum.

According to some examples of the inventive concept, the second semiconductor chip 210 may be disposed beneath the bottom surface of the redistribution pattern 500, and the third semiconductor chip 310 may be disposed on the top surface of the redistribution pattern 500. If the second semiconductor chip 210 were instead disposed on a top surface of the third semiconductor chip 310, the semiconductor package would need bonding wires connecting the second semiconductor chip 210 to the redistribution pattern 500. However, according to some examples of the inventive concept, bonding wires are unnecessary, and thus a height of the semiconductor package 1 may be minimal. If the second semiconductor chip 210 were disposed on the third semiconductor chip 310 and connected to the third semiconductor chip 310 through a solder ball, a through-via extending through the third semiconductor chip 310 would be necessary. However, according to some examples of the inventive concept, the semiconductor package 1 does not have such through-vias, and thus it is relatively simple to fabricate the semiconductor package 1. The average thickness D2 of the redistribution pattern 500 can be smaller than that of a printed circuit board (PCB). For example, the average thickness D2 of the redistribution pattern 500 may range from about 0.1 mm to about 0.5 mm. Thus, the size of the semiconductor package 1 may be minimized.

The third molding layer 320 may be provided on the redistribution pattern 500 to cover the third semiconductor chip 310. The third molding layer 320 may be formed of an insulating polymer such as an epoxy molding compound (EMC).

Figure 2:
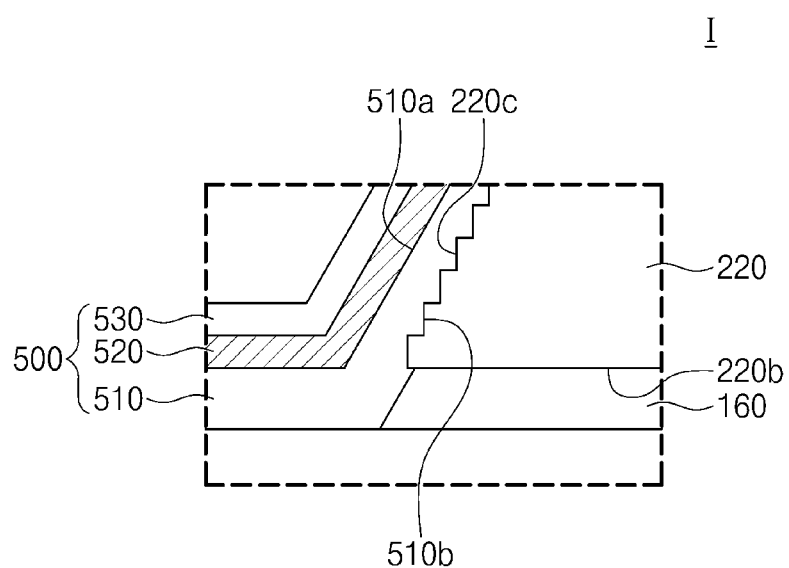
FIG. 2 is an enlarged view of a region 'I' of FIG. 1 to illustrate a second molding layer and a redistribution pattern of a semiconductor package according to some examples of the inventive concept.

FIG. 2 is an enlarged view of a region 'I' of FIG. 1 to illustrate a second molding layer and a redistribution pattern of a semiconductor package according to some examples of the inventive concept.

Referring to FIGS. 1 and 2, the sidewall surface 220c of the second molding layer 220 may be inclined. As was described above, the "inclination" of the sidewall surface 220c may be an average gradient between both ends (top and bottom) of the surface. The sidewall surface 220c of the second molding layer 220 may have a staircase shape having first portions and second portions which are alternately repeated. The first portions may be parallel to the top surface 100a of the substrate 100 (i.e., may be horizontal surfaces in the orientation shown in the figure), and the second portions may be perpendicular to the top surface 100a of the substrate 100 (i.e., may be vertical surfaces). In this case, an imaginary line connecting both ends of the sidewall surface 220c of the second molding layer 220 extends in a direction that is oblique with respect to the top surface 100a of the substrate 100. That is, the imaginary line connecting both ends of the sidewall surface 220c may subtend an acute angle with the bottom surface 220b of the second molding layer 220. However, the shape of the sidewall surface 220c of the second molding layer 220 is not limited to the flat shape or the staircase shape but may have any of various other shapes as long as the "inclination" of the surface is oblique with respect to the top surface 100a of the substrate 100. Thus, in any of these other examples, the cross-sectional shape (of the molding layer 220) of the second package PKG2 may be substantially trapezoidal.

The first insulating pattern 510 may be disposed on the sidewall surface 220c of the second molding layer 220 to have a staircase-shaped bottom surface 510b. A top surface 510a of the first insulating pattern 510 may be a flat surface inclined in a direction that is oblique relative to the top surface 100a of the substrate 100. The conductive pattern 520 may extend on the sidewall surface 220c of the second molding layer 220 in the direction of inclination and may be flat. However, examples of the inventive concept are not limited to the aforementioned shapes of the top surface 510a of the first insulating pattern 510, the conductive pattern 520, and the second insulating pattern 530.

Figure 3:
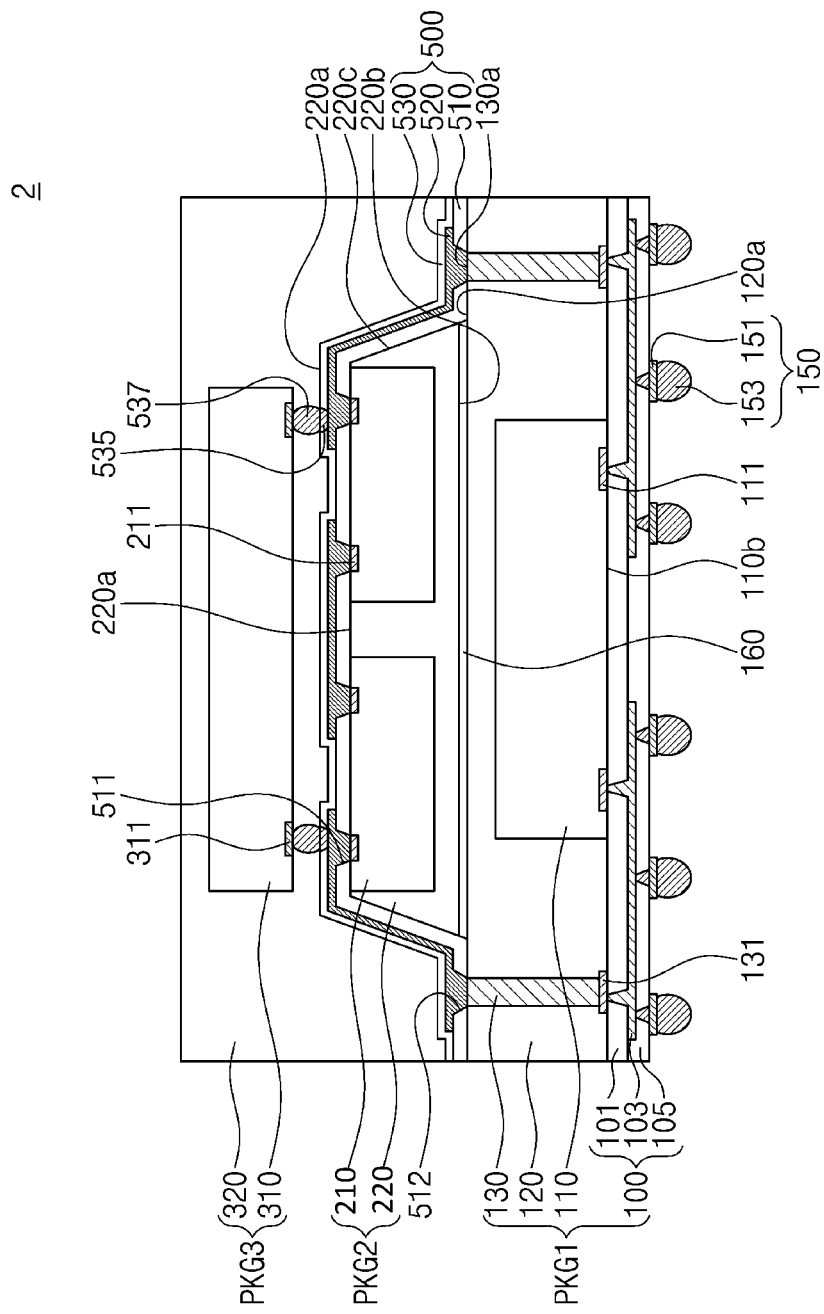
FIG. 3 is a cross-sectional view illustrating a semiconductor package according to some examples of the inventive concept.

FIG. 3 is a cross-sectional view illustrating a semiconductor package according to some examples of the inventive concept.

Referring to FIG. 3, a semiconductor package 2 may include first to third packages PKG1, PKG2, and PKG3 and a redistribution pattern 500. The first and third packages PKG1 and PKG3 and the redistribution pattern 500 may be the same as those described with reference to FIG. 1. For example, the first package PKG1 may include a substrate 100, a first semiconductor chip 110, a first molding layer 120, and an interconnection 130. A redistribution layer may be used as the substrate 100. The third package PKG3 may include a third semiconductor chip 310 and a third molding layer 320.

The second package PKG2 may include a second semiconductor chip 210 and a second molding layer 220. In these examples, the second package PKG2 has a plurality of the second semiconductor chips 210. The second semiconductor chips 210 may be laterally arranged. The second chip pads 211 of the second semiconductor chips 210 may be connected to the redistribution pattern 500.

In some examples, a plurality of the first semiconductor chips 110 may be provided. The first semiconductor chips 110 may be laterally arranged.

A method of fabricating a semiconductor package according to examples of the inventive concept will be described hereinafter.

FIGS. 4A to 4H are cross-sectional views illustrating a method of fabricating a semiconductor package, according to some examples of the inventive concept. Hereinafter, the terms "top surface" and "bottom surface" are used as described with reference to FIG. 1, regardless of the orientation of the surface during the particular stage of the method illustrated and being described. Hereinafter, technical features already mentioned and described in detail above will not be described in detail again or will only be mentioned briefly for the sake of brevity and for ease and convenience of explanation.

Figure 4A:
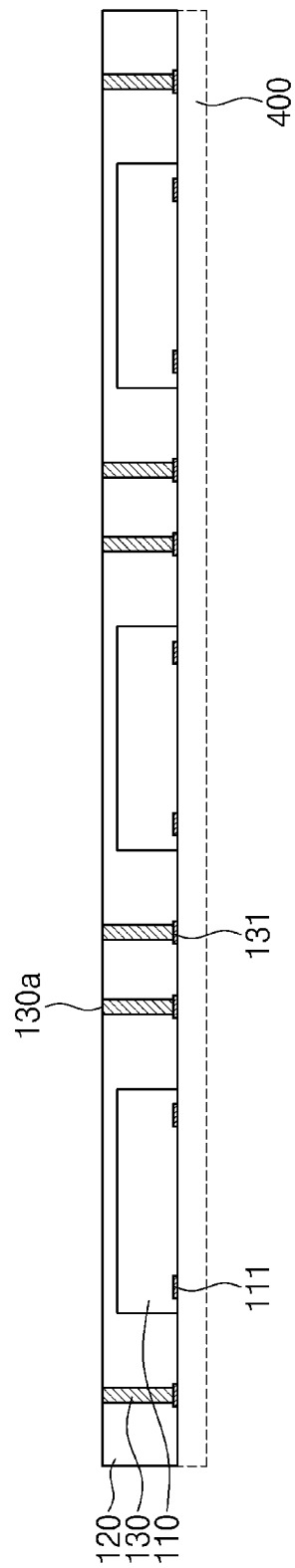
FIGS. 4A to 4H are cross-sectional views illustrating a method of fabricating a semiconductor package, according to some examples of the inventive concept.

Referring to FIG. 4A, a first semiconductor chip 110 may be provided on a carrier substrate 400. The first semiconductor chip 110 may be provided in multiples on the carrier substrate 400. First chip pads 111 of the first semiconductor chips 110 may face the carrier substrate 400. Connection pads 131 and interconnections 130 may be formed on the carrier substrate 400 at positions laterally spaced apart from the first semiconductor chips 110, e.g., in fan out zones. A first molding layer 120 may be formed on the carrier substrate 400 to cover the first semiconductor chips 110. The first molding layer 120 may cover sides of the interconnections 130 but may not cover top surfaces 130a of the interconnections 130. Subsequently, the carrier substrate 400 may be removed to expose the first chip pads 111 of the first semiconductor chips 110. In some examples, the formation of the interconnections 130 may be omitted in these processes.

Figure 4B:
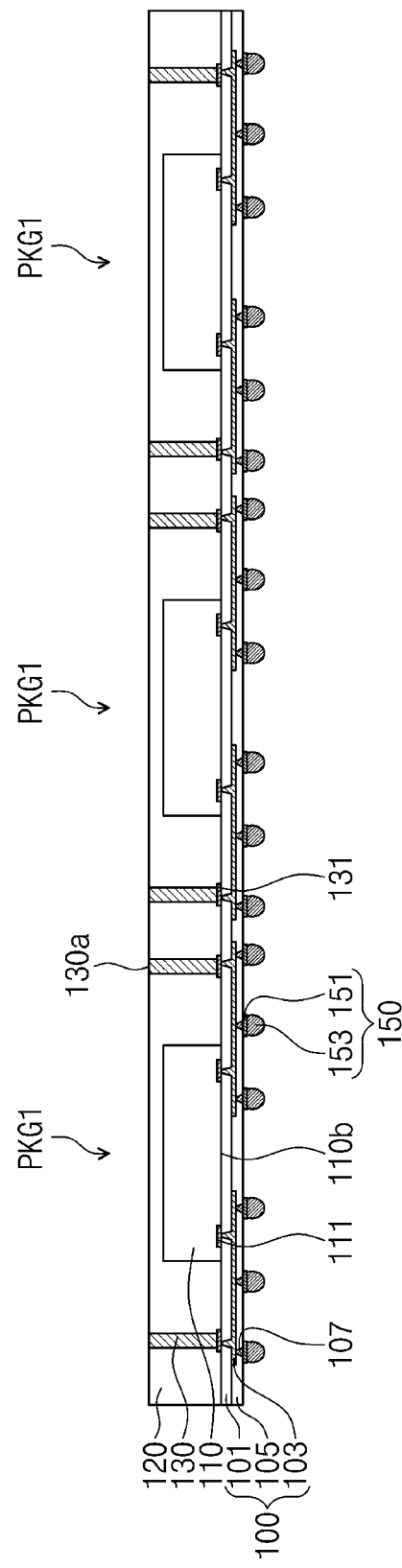

Referring to FIG. 4B, insulating layers 101 and 105 and metal patterns 103 may be formed on bottom surfaces 110b of the first semiconductor chips 110 and a bottom surface of the first molding layer 120, thereby fabricating a substrate 100. The first insulating layer 101 may be formed on the bottom surfaces 110b of the first semiconductor chips 110 and the bottom surface of the first molding layer 120. The first insulating layer 101 may expose the first chip pads 111 of the first semiconductor chips 110 and the connection pads 131. The metal patterns 103 may be formed on a bottom surface of the first insulating layer 101 by an electroplating process. The metal patterns 103 may extend into the first insulating layer 101 so as to be connected to the first chip pads 111 and connection pads 131. The second insulating layer 105 may be formed to cover the metal patterns 103. Connection vias 107 may be formed to penetrate the second insulating layer 105. The connection vias 107 may be connected to the metal patterns 103. External pads 151 may be formed on a bottom surface of the second insulating layer 105 so as to be connected to the connection vias 107. Solder balls 153 may be formed on the external pads 151, thereby forming external terminals 150. Each of the external terminals 150 may include a respective one of the external pads 151 and a respective one of the solder balls 153. Thus, wafer-level first packages PKG1 may be fabricated. In some examples, the interconnections 130 may not be formed in the process described with reference to FIG. 4A but may be formed after the fabrication of the substrate 100.

Figure 4C:
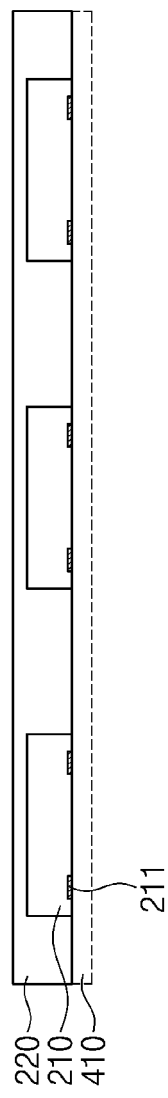

Referring to FIG. 4C, a second semiconductor chip 210 and a second molding layer 220 may be formed on a support substrate 410. The second semiconductor chip 210 may be provided in multiples on the support substrate 410. Second chip pads 211 of the second semiconductor chips 210 may face the support substrate 410. The second molding layer 220 may cover the second semiconductor chips 210 but may not cover the second chip pads 211. Subsequently, the support substrate 410 may be removed to expose the second chip pads 211 of the second semiconductor chips 210.

Figure 4D:
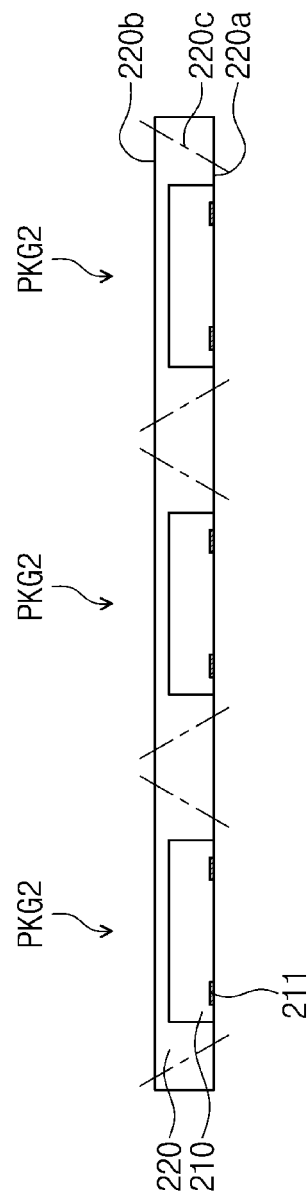

Referring to FIG. 4D, the second molding layer 220 may be sawn to separate second packages PKG2 from each other. The second molding layer 220 may be sawn using a blade or laser. The second molding layer 220 may be sawn in a direction inclined obliquely relative to a bottom surface 220b of the second molding layer 220. For example, the sidewall surface 220c of the second molding layer 220 may subtend an acute angle with the bottom surface 220b of the second molding layer 220 In some examples, the second molding layer 220 may be sawn by a step-cut technique so that a sidewall surface 220c of the second molding layer 220 has the staircase shape illustrated in FIG. 2. However, examples of the inventive concept are not limited to producing the above-mentioned shapes of the sidewall surface 220c of the second molding layer 220. Other forms of an inclined sidewall surface 220c of the second molding layer 220 may be formed by various sawing processes dependent on the desired form, as long as the overall form is inclined as has been described above.

Figure 4E:
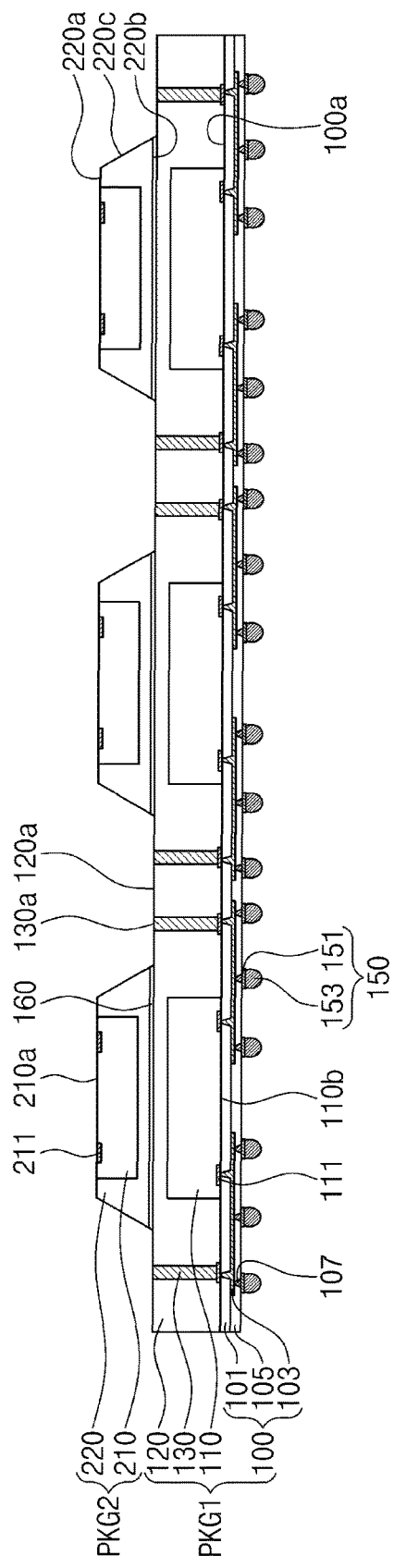

Referring to FIG. 4E, the second packages PKG2 may be stacked on the first packages PKG1. At this time, bottom surfaces 220b of the second molding layers 220 of the second packages PKG2 may face the first molding layer 120 and may be disposed substantially parallel to the top surface 100a of the substrate 100. The sidewall surfaces 220c of the second molding layers 220 of the second packages PKG2 may be parallel to the aforementioned direction of inclination. An adhesive film 160 may be formed on the first package PKG1 or beneath the second packages PKG2 before the second packages PKG2 are stacked on the first package PKG1 so that the film 160 is interposed between the first molding layer 120 and each of the second molding layers 220 to adhere each of the second molding layers 220 to the first molding layer 120. The second packages PKG2 may not cover a portion of the top surface 120a of the first molding layer 120 and the top surfaces 130a of the interconnections 130. In some examples, the interconnections 130 may not be formed in the process described with reference to FIG. 4A but may be formed after the second packages PKG2 are stacked on the first packages PKG1.

Figure 4F:
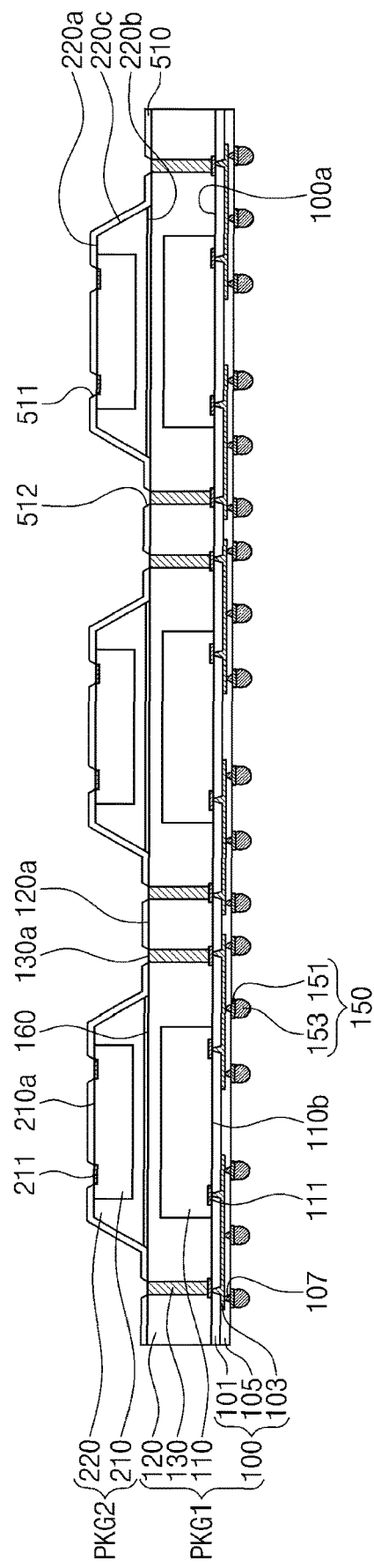

Referring to FIG. 4F, a first insulating pattern 510 may be formed on the first packages PKG1 and the second packages PKG2. The first insulating pattern 510 may extend along the top surface 120a of the first molding layer 120 not covered by the second packages PKG2, the sidewall surfaces 220c of the second molding layers 220, the top surfaces 220a of the second molding layers 220, and the top surfaces 210a of the second semiconductor chips 210. The first insulating pattern 510 may be patterned using a photolithography process to form first openings 511 and second openings 512 in the first insulating pattern 510. The first openings 511 may expose the second chip pads 211, and the second openings 512 may expose the interconnections 130. The first insulating pattern 510 may be formed of material which was described with reference to FIG. 1.

Figure 4G:
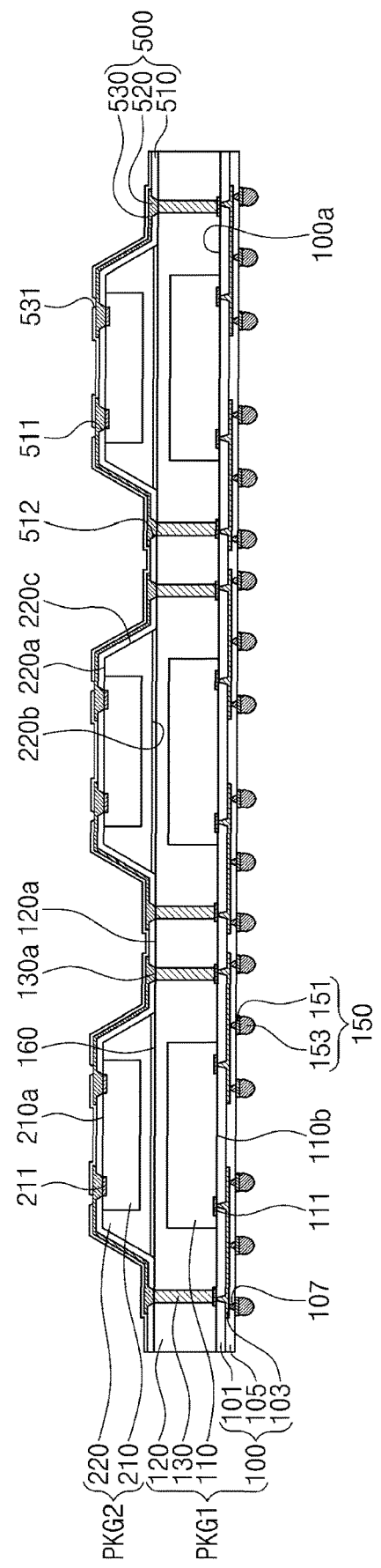

Referring to FIG. 4G, conductive patterns 520 may be formed on the first insulating pattern 510. The conductive patterns 520 may extend into the first openings 511 and the second openings 512 so as to be connected to the second chip pads 211 and the interconnections 130. The conductive patterns 520 may be formed using an electroplating process.

A second insulating pattern 530 may be formed to cover the conductive patterns 520. The second insulating pattern 530 may be patterned to form third openings 531 exposing the conductive patterns 520. Thus, redistribution patterns 500 may be fabricated.

Figure 4H:
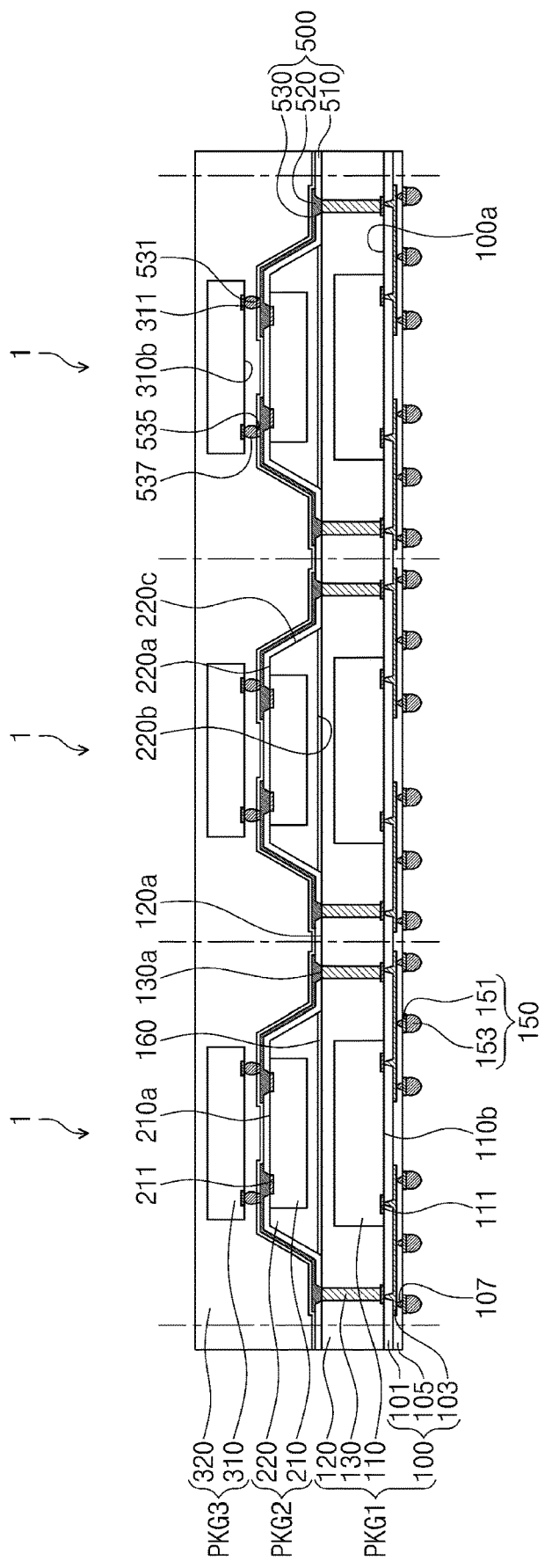

Referring to FIG. 4H, third packages PKG3 may be formed on the redistribution patterns 500. For example, third semiconductor chips 310 may be disposed on the redistribution patterns 500. Third chip pads 311 of the third semiconductor chips 310 may face the redistribution patterns 500. For example, the third semiconductor chips 310 may be provided on the parts of the redistribution patterns 500 disposed on the second packages PKG2, respectively. Vias 535 may be formed in the third openings 531 by filling the third openings 531 with conductive material. Connection terminals 537 may be formed on the redistribution patterns 500 so as to be connected to the vias 535 and the third chip pads 311. In some examples, connection pads (not shown) may be formed so as to be interposed between the vias 535 and the connection terminals 537, respectively. A third molding layer 320 may be formed to cover the redistribution patterns 500 and the third semiconductor chips 310.

The first and third molding layers 130 and 320 and the substrate 100 may be sawn along locations represented by the dashed dotted lines in FIG. 4H, thereby separating semiconductor packages 1 from each other. Each of the semiconductor packages 1 may be the same as described with reference to FIG. 1.

Figure 5:
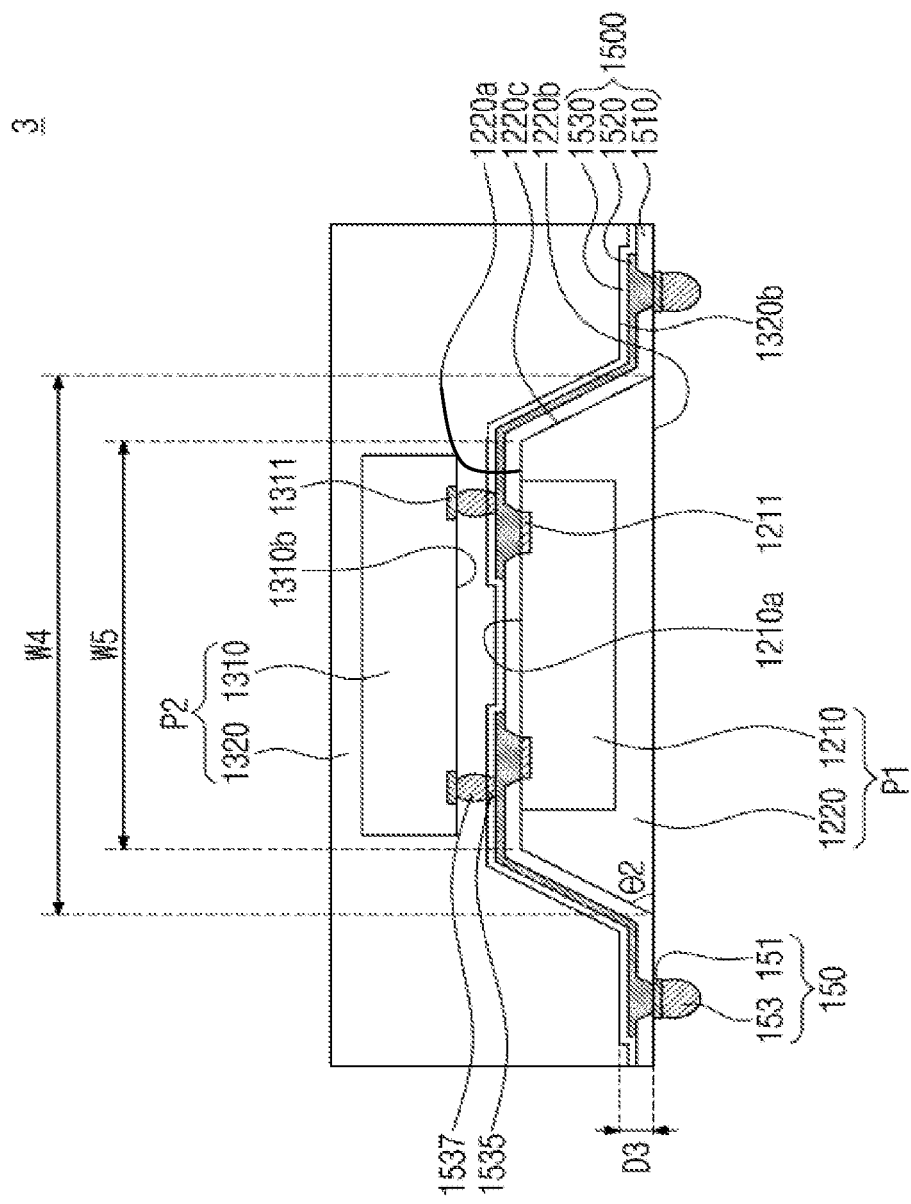
FIG. 5 is a cross-sectional view illustrating a semiconductor package according to some examples of the inventive concept.

FIG. 5 is a cross-sectional view illustrating a semiconductor package according to some other examples of the inventive concept.

Referring to FIG. 5, a semiconductor package 3 may include a lower package P1, a redistribution substrate 1500, and an upper package P2. The lower package P1 may include a lower semiconductor chip 1210 and a lower molding layer 1220. The lower package P1 may be similar to the second package PKG2 described with reference to FIG. 1. For example, the lower semiconductor chip 1210 may include lower chip pads 1211 disposed at a top surface 1210a thereof. The lower molding layer 1220 may cover a sidewall surface and a bottom surface of the lower semiconductor chip 1210 but may not cover the top surface 1210a of the lower semiconductor chip 1210. The lower molding layer 1220 may have a top surface 1220a, a bottom surface 1220b, and a sidewall surface 1220c. A width W5 at the top surface 1220a of the lower molding layer 1220 (i.e., a width W5 of a top surface of the lower package P1) may be smaller than a width W4 at the bottom surface 1220b of the lower molding layer 1220 (i.e., a width W4 of a bottom surface of the lower package P1). The sidewall surface 1220c of the lower molding layer 1220 may extend to and between an edge of the top surface 1220a and an edge of the bottom surface 1220b. The sidewall surface 1220c of the lower molding layer 1220 may be inclined obliquely relative to the bottom surface 1220b of the lower molding layer 1220. For example, an angle θ2 between the sidewall surface 1220c and the bottom surface 1220b of the lower molding layer 1220 may be an acute angle.

The redistribution substrate 1500 may be provided on the lower package P1. The redistribution substrate 1500 may be similar to the redistribution pattern 500 described with reference to FIG. 1. The redistribution substrate 1500 may be provided along the top surface 1220a and the sidewall surface 1220c of the lower molding layer 1220. The redistribution substrate 1500 may further extend along a bottom surface 1320b of an upper molding layer 1320 to have a bottom surface substantially coplanar with the bottom surface 1220b of the lower molding layer 1220. The redistribution substrate 1500 disposed on the sidewall surface 1220c of the lower molding layer 1220 may be inclined relative to the bottom surface 1220b of the lower molding layer 1220.

The redistribution substrate 1500 may include a first insulating pattern 1510, a conductive pattern 1520, and a second insulating pattern 1530 which are sequentially stacked. The first insulating pattern 1510 may be provided along the sidewall surface 1220c and the top surface 1220a of the lower molding layer 1220 and may laterally extend from a bottom end portion of the lower molding layer 1220. A bottom surface of the lateral extension of the first insulating pattern 1510 may not be covered by the lower molding layer 1220. The conductive pattern 1520 may be provided on the first insulating pattern 1510. The conductive pattern 1520 may extend into the first insulating pattern 1510 so as to be connected to the lower chip pads 1211. The second insulating pattern 1530 may cover the conductive patterns 1520. Vias 1535 may be provided in the second insulating pattern 1530 so as to be connected to the conductive pattern 1520. The redistribution substrate 1500 may be thinner than a corresponding or comparative printed circuit board (PCB). For example, the redistribution substrate 1500 may have a thickness D3 of about 0.1 mm to about 0.5 mm.

External terminals 150 may be provided on the bottom surface of the redistribution substrate 1500. Here, the bottom surface of the redistribution substrate 1500 may be exposed by the lower molding layer 1220. The conductive pattern 1520 may extend into the first insulating pattern 1510 so as to be connected to the external terminals 150. Each of the external terminals 150 may include a respective one of external pads 151 and a respective one of the solder balls 153.

The upper package P2 may be provided on the redistribution substrate 1500. The upper package P2 may include an upper semiconductor chip 1310 and the upper molding layer 1320. The upper package P2 may be similar to the third package PKG3 described with reference to FIG. 1. The upper semiconductor chip 1310 may include upper chip pads 1311 disposed at a bottom surface 1310*b* thereof, and thus the bottom surface 1310*b* of the upper semiconductor chip 1310 may be the active surface of the upper semiconductor chip 1310. Connection terminals 1537 may be provided on the vias 1535 so as to be connected to the upper chip pads 1311 of the upper semiconductor chip 1310.

According to some examples of the inventive concept, the upper semiconductor chip 1310 and the lower semiconductor chip 1210 may be electrically connected to the external terminals 150 through the redistribution substrate 1500. Thus, an additional upper substrate is unnecessary, and thus the size of the semiconductor package 3 may be minimized.

Figure 6A:
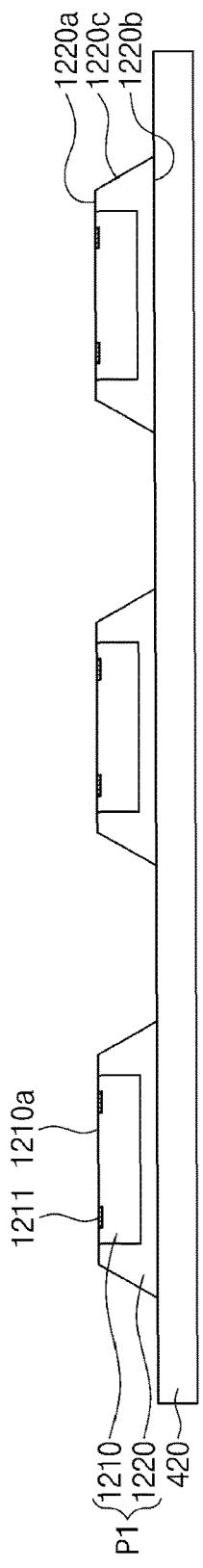
FIGS. 6A to 6C are cross-sectional views illustrating a method of fabricating a semiconductor package, according to some examples of the inventive concept.
Figure 6B:
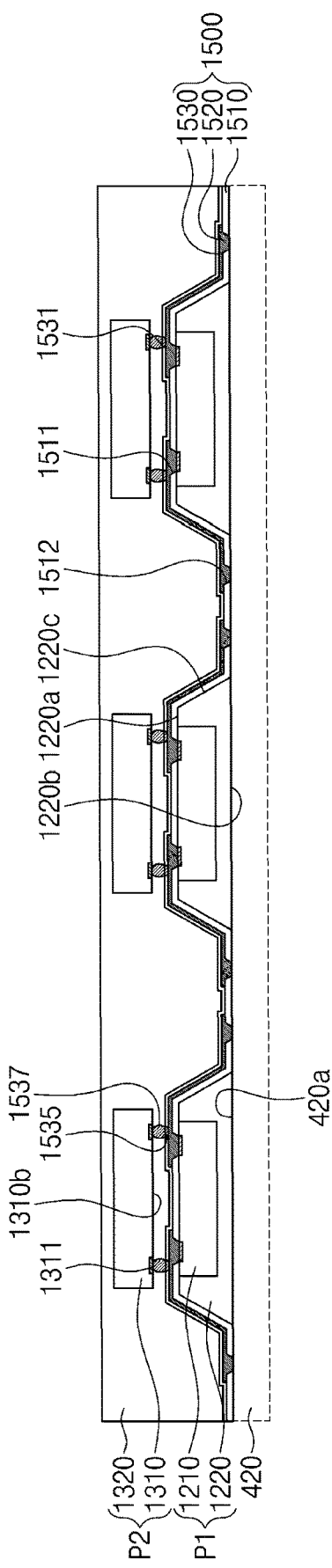
Figure 6C:
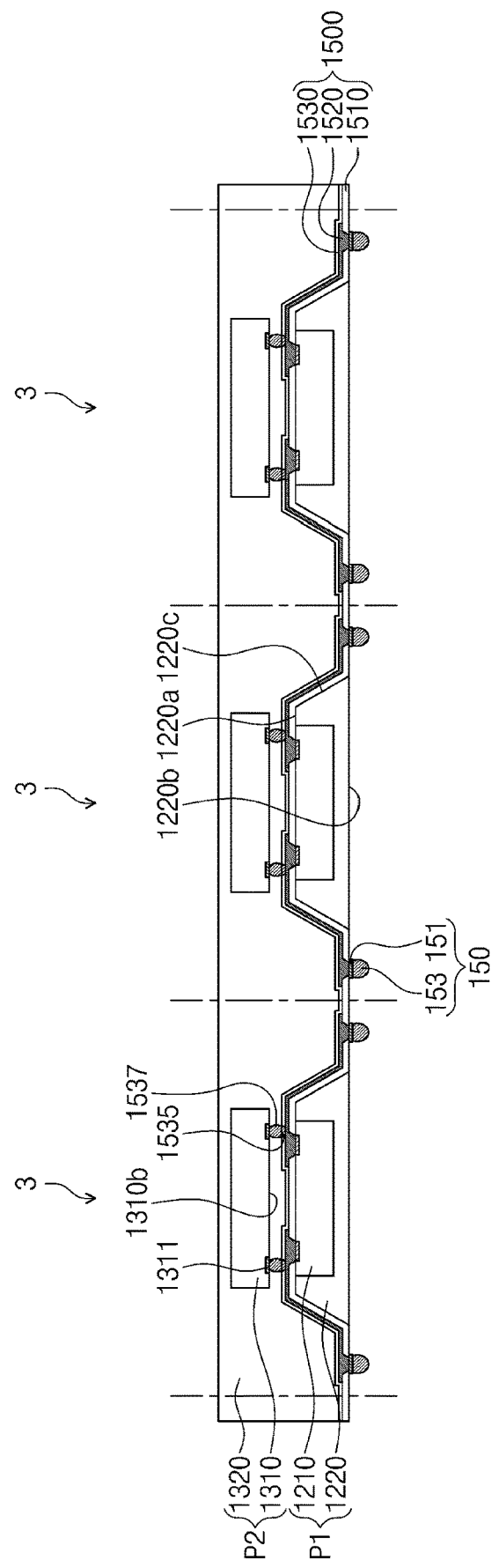

FIGS. 6A to 6C are cross-sectional views illustrating a method of fabricating a semiconductor package, according to some examples of the inventive concept. Hereinafter, elements that are the same as those described in detail above will not be described in detail again or only mentioned briefly for the sake of brevity and for ease and convenience of explanation.

Referring to FIG. 6A, a lower package P1 may be located on a temporary substrate 420. The lower package P1 may include a lower semiconductor chip 1210 and a lower molding layer 1220. The lower package P1 may be the same as that described with reference to FIG. 5 and may be fabricated by the same technique as that of fabricating the second package PKG2 described with reference to FIGS. 4C and 4D. The lower package P1 may be provided in multiples on the temporary substrate 420. The lower packages P1 may be laterally spaced apart from each other on the temporary substrate 420. Bottom surfaces 1220*b* of the lower molding layer 1220 may face the temporary substrate 420. A sidewall surface 1220*c* of the lower molding layer 1220 may be parallel to the aforementioned direction of inclination.

Referring to FIG. 6B, a redistribution substrate 1500 and an upper package P2 may be formed on the temporary substrate 420. The redistribution substrate 1500 may be the same as that described with reference to FIG. 5 and may be fabricated by the same technique as described with reference to FIGS. 4F and 4G. For example, the redistribution substrate 1500 may include the first insulating pattern 1510, the conductive pattern 1520, and the second insulating pattern 1530 which are sequentially stacked. The conductive pattern 1520 may extend into first and second openings 1511 and 1512 formed in the first insulating pattern 1510. The redistribution pattern 1500 may extend along the top surface 1220*a* of the lower molding layer 1220, the sidewall surface 1220*c* of the lower molding layer 1220, and the top surface 420*a* of the temporary substrate 420.

The upper package P2 may be the same as that described with reference to FIG. 5 and may be fabricated by the same technique as that of fabricating the third package PKG3 described with reference to FIG. 4H. For example, the upper semiconductor chip 1310 may be disposed on the redistribution substrate 1500 and may be connected to the redistribution substrate 1500. The upper semiconductor chip 1310 may be provided in multiples on the redistribution substrate 1500. The upper semiconductor chips 1310 may overlie the lower packages P1, respectively. The upper molding layer 1320 may be formed on the redistribution substrate 1500 to cover the upper semiconductor chips 1310. The temporary substrate 420 may be removed to expose the conductive patterns 1520 disposed in the second openings 1512.

Referring to FIGS. 5 and 6C, external terminals 150 may be formed on an exposed bottom surface of the redistribution substrate 1500. Each of the external terminals 150 may be connected to respective conductive pattern 1520 disposed in a one of the second openings 1512. Each external terminal 150 may include an external pad 151 and a solder ball 153 and may be the same as that described with reference to FIG. 5. The upper molding layer 1320 and the redistribution substrate 1500 may be sawn along regions denoted by the dashed dotted lines in FIG. 6C, thereby separating semiconductor packages 3 from each other. Each of the semiconductor packages 3 may be the same as that described with reference to FIG. 5.

According to some examples of the inventive concept, the second package may have the inclined sidewall surfaces, and thus the redistribution pattern may be formed on the first package and the second package. The second and third semiconductor chips may be electrically connected to the substrate through the redistribution pattern. Thus, an additional upper substrate may be omitted in the semiconductor package according to some examples of the inventive concept. The redistribution pattern may be relatively thin. The size of the semiconductor package may be minimized due to the provision of the redistribution pattern.

Although the inventive concept have been described with reference to several examples thereof, it will be apparent to those skilled in the art that various changes and modifications may be made to such examples without departing from the spirit and scope of the inventive concept. Therefore, it should be understood that the above examples are not limiting, but illustrative. Thus, the scope of the inventive concept is to be determined by the broadest permissible interpretation of the following claims, and shall not be restricted or limited by the foregoing description.

What is claimed is:

1. A semiconductor package comprising:
  a first package comprising a substrate, a first semiconductor chip mounted on the substrate, a first molding layer covering the first semiconductor chip on the substrate, and at least one electrical interconnection within the first molding layer;
  a second package disposed on the first molding layer, the second package comprising
    a second semiconductor chip having a chip pad, a bottom surface spaced from the first molding layer and a top surface at which the chip pad is situated, and
    a second molding layer covering the bottom surface and sides of the second semiconductor chip,
    the second molding layer having a bottom surface narrower than the first package in a given direction parallel to a top surface of the substrate, a top surface narrower than the bottom surface of the second molding layer in said given direction, and a sidewall surface that extends in a direction of inclination that is oblique relative to the top surface of the substrate;
  a redistribution wiring layer pattern extending along a top surface of the first molding layer, the sidewall surface of the second molding layer, and the top surface of the second molding layer, the redistribution wiring layer pattern being electrically connected to the at least one electrical interconnection and the chip pad; and
  a third semiconductor chip disposed on the redistribution wiring layer pattern.

2. The semiconductor package of claim 1, wherein an adhesive film is interposed between the first molding layer and the second molding layer.

3. The semiconductor package of claim 1, wherein the redistribution wiring layer pattern disposed on the sidewall surface of the second molding layer extends parallel to the direction of inclination.

4. The semiconductor package of claim 1, wherein the second package exposes at least a portion of the top surface of the first molding layer and a top surface of the at least one electrical interconnection.

5. The semiconductor package of claim 1, further comprising:
a third molding layer covering the third semiconductor chip.

6. The semiconductor package of claim 1, wherein an active surface of the third semiconductor chip faces the redistribution wiring layer pattern.

7. A semiconductor package comprising:
a lower package; and
an upper package on the lower package,
wherein the lower package comprising
a first redistribution layer,
a first lower semiconductor chip on the first redistribution layer,
a second lower semiconductor chip disposed over the first lower semiconductor chip and having a chip pad on a top surface thereof,
a first molding layer disposed on the first redistribution layer and covering a sidewall of the first lower semiconductor chip,
a second molding layer covering a sidewall and a bottom surface of the second lower semiconductor chip,
a via interconnection disposed in the first molding layer and electrically connected to the first redistribution layer, and
a second redistribution layer on the second lower semiconductor chip and the first molding layer, the second redistribution layer being in contact with the chip pad of the second lower semiconductor chip and the via interconnection,
wherein the upper package comprising an upper semiconductor chip having an upper chip pad on the second redistribution layer, the upper chip pad disposed at a bottom surface of the upper semiconductor chip and being in contact with the second redistribution layer,
wherein the first lower semiconductor chip having a chip pad on a bottom surface thereof, and
wherein the chip pad of the first lower semiconductor chip is electrically connected to the first redistribution layer.

8. The semiconductor package of claim 7, wherein the lower package further comprising external terminals on a bottom surface of the first redistribution layer and electrically connected to the first redistribution layer.

9. The semiconductor package of claim 7, wherein the first molding layer exposes an upper surface of the via interconnection and the second molding layer exposes the chip pad of the second lower semiconductor chip.

10. The semiconductor package of claim 7, wherein the second redistribution layer is not provided in a gap between the first lower semiconductor chip and the second lower semiconductor chip.

11. The semiconductor package of claim 7, wherein the upper semiconductor chip is not vertically overlapped with the via interconnection.

12. The semiconductor package of claim 7, wherein the upper package further comprising a third molding layer disposed on the second redistribution layer and covering the upper semiconductor chip.

13. The semiconductor package of claim 7, wherein the first molding layer physically contacts a sidewall of the via interconnection.

14. The semiconductor package of claim 7, wherein the second redistribution layer comprises:
a first insulating pattern on the first and second molding layers, the first insulating pattern having a first opening exposing the chip pad of the second lower semiconductor chip and a second opening exposing the via interconnection,
a conductive pattern on the first insulating pattern, the conductive pattern extending into the first and second openings, and
a second insulating pattern on the conductive pattern.

15. The semiconductor package of claim 14, wherein the second lower semiconductor chip is electrically connected to the conductive pattern.

16. A semiconductor package comprising:
a first package comprising a substrate, a first semiconductor chip mounted on the substrate, a first molding layer covering the first semiconductor chip and the substrate, and at least one interconnection that extends through the first molding layer;
a second package disposed on the first molding layer and comprising a second semiconductor chip and a second molding layer,
the second semiconductor chip having a top surface with a chip pad disposed thereon and a bottom surface,
the second molding layer covering the bottom surface and sides of the second semiconductor chip,
the second molding layer comprising a bottom surface having a first width extending along a first direction parallel to a top surface of the substrate, a top surface having a second width extending along the first direction, and a sidewall surface extending between the top and bottom surfaces of the second molding layer, wherein the first width is greater than the second width;
a redistribution wiring layer pattern extending along a top surface of the first molding layer, the sidewall surface of the second molding layer, and the top surface of the second molding layer, the redistribution wiring layer pattern electrically connected to the at least one interconnection and the chip pad; and
a third package disposed on the redistribution wiring layer pattern.

17. The semiconductor package of claim 16, wherein the third package comprises:
a third semiconductor chip having a first surface including a chip pad electrically connected to the redistribution wiring layer pattern, the first surface facing the redistribution wiring layer pattern; and
a third molding layer covering the third semiconductor chip and the redistribution wiring layer pattern.

18. The semiconductor package of claim 16, wherein the second package further comprises at least one additional second semiconductor chip having a top surface with a chip pad disposed thereon and a bottom surface,
wherein the redistribution wiring layer pattern is electrically connected to the chip pad of the at least one additional second semiconductor chip, and the second molding layer covers the bottom surface and sides of the at least one additional second semiconductor chip.

19. The semiconductor package of claim 16, wherein the sidewall surface of the second molding layer is stepped.

* * * * *